United States Patent [19]

Hughes et al.

[11] Patent Number: 5,591,676
[45] Date of Patent: Jan. 7, 1997

[54] METHOD OF MAKING A SEMICONDUCTOR DEVICE HAVING A LOW PERMITTIVITY DIELECTRIC

[75] Inventors: Henry G. Hughes; Ping-Chang Lue; Frederick J. Robinson, all of Scottsdale, Ariz.

[73] Assignee: Motorola, Inc., Schaumburg, Ill.

[21] Appl. No.: 405,056

[22] Filed: Mar. 16, 1995

Related U.S. Application Data

[62] Division of Ser. No. 191,736, Feb. 4, 1994, Pat. No. 5,442,237, which is a continuation of Ser. No. 779,663, Oct. 21, 1991, abandoned.

[51] Int. Cl.⁶ .................................................. H01L 21/3105
[52] U.S. Cl. ........................... 437/195; 437/231; 437/235; 427/384; 430/313
[58] Field of Search ................................ 437/231, 235, 437/388.4, 384, 385.5, 372.2, 195, 247; 430/313, 315

[56] References Cited

U.S. PATENT DOCUMENTS

| | | |
|---|---|---|
| 2,811,471 | 10/1957 | Homeyer . |
| 3,563,785 | 2/1971 | Oga et al. . |
| 4,104,225 | 8/1978 | Conbere ............................ 260/29.6 F |
| 4,676,867 | 6/1987 | Elkins et al. . |
| 4,705,606 | 11/1987 | Young et al. ............................... 204/15 |
| 4,801,507 | 1/1989 | Estes et al. ................................ 437/235 |
| 4,849,305 | 7/1989 | Yanagisawa ............................ 428/695 |
| 4,965,134 | 10/1990 | Ahne et al. ................................ 437/231 |
| 4,966,584 | 2/1991 | Young et al. . |
| 4,997,869 | 3/1991 | Eisenbraun et al. ..................... 437/231 |
| 5,034,801 | 7/1991 | Fischer . |
| 5,055,342 | 10/1991 | Markovich et al. . |
| 5,073,814 | 12/1991 | Cole et al. . |
| 5,401,334 | 3/1995 | O'Melia et al. ......................... 428/421 |
| 5,409,777 | 4/1995 | Kennedy et al. ..................... 428/411.1 |

FOREIGN PATENT DOCUMENTS

| | | | |
|---|---|---|---|
| 2751517 | 5/1979 | Germany . | |
| 56-37632 | 4/1981 | Japan ..................................... 437/235 |
| 58-3249 | 1/1983 | Japan ..................................... 437/235 |
| 59-36944 | 2/1984 | Japan ..................................... 437/235 |
| 3-165036 | 7/1991 | Japan . | |

OTHER PUBLICATIONS

S. Wolf, "Silicon Processing for the VLSI Era", vol. II, 1990, pp. 196–199, 214–215.

"Optimization of a Fine Line Air Bridge Process," by J. Huang et al., published in the 1990 U.S. Conference on GaAs Manufacturing Technology Nevada, pp. 18–21.

*Primary Examiner*—Charles L. Bowers, Jr,
*Assistant Examiner*—Leon Radomsky
*Attorney, Agent, or Firm*—Bruce T. Neel

[57] ABSTRACT

A semiconductor device having electronic circuitry formed in a semiconductor substrate (11) and separated from an overlying metal interconnect layer (18,18') using a fluorinated polymer dielectric (14,14') . The fluorinated polymer layer (14,14') may be formed directly on metallic surfaces, or formed on a semiconductor or non-metallic surface using an adhesion promoter (13,13'). Once formed, the fluorinated polymer layer (14,14') can be patterned to provide vias, and covered with a patterned metal interconnect layer (18,18') .

7 Claims, 2 Drawing Sheets

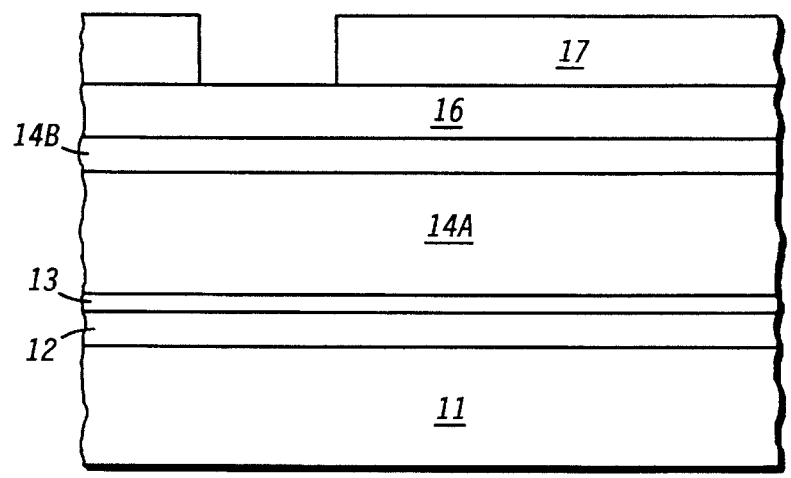
FIG. 1
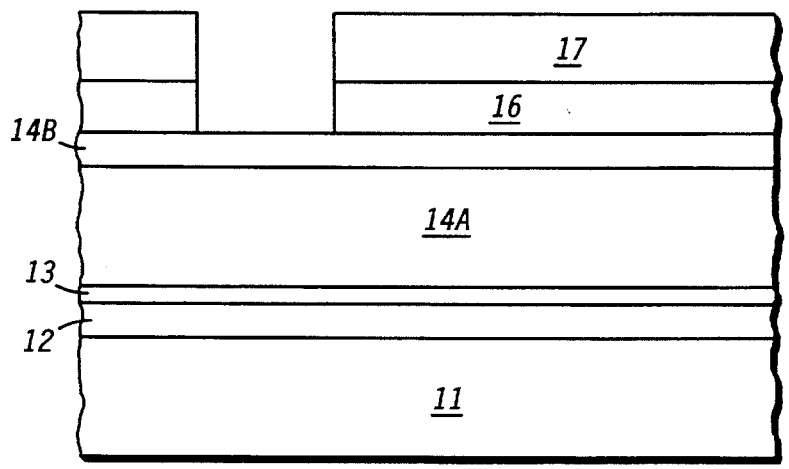
FIG. 2
FIG. 3
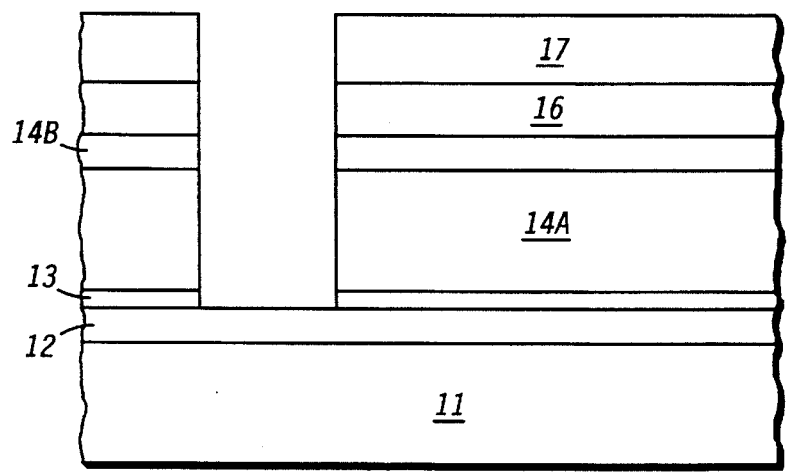

1

METHOD OF MAKING A SEMICONDUCTOR DEVICE HAVING A LOW PERMITTIVITY DIELECTRIC

This is a division of application Ser. No. 08/191,736, now U.S. Pat. No. 5,442,237, filed Feb. 4, 1994, which is a continuation of Ser. No. 07/779,663, filed Oct. 21, 1991, now abandoned.

BACKGROUND OF THE INVENTION

The present invention relates, in general, to dielectrics used in manufacturing semiconductor devices, and more particularly, to dielectrics having low dielectric constant.

Dielectric materials are widely used in the semiconductor industry to separate metal interconnect layers from active devices formed in a semiconductor substrate. Dielectrics are also used to separate two adjacent metal interconnect layers to prevent shorting between the metal layers. Conventionally, the semiconductor industry uses chemical vapor deposited glass, spin-on glass or spin-on polyimide as dielectric materials.

One disadvantage of spin-on glass and polyimide dielectrics is their relatively high permittivity or dielectric constant. Typically, spin-on glass has a relative (to permittivity of free space) dielectric constant in excess of 3.8, while polyimides have relative dielectric constants in the range of 2.8–3.5. High dielectric constant materials produce capacitive loads on the adjacent conductors which degrades performance of both high frequency and high density transistors. Because semiconductor industry trends are towards smaller transistor structures with correspondingly smaller output drive, capacitive loading caused by interlayer dielectric materials is a mounting concern.

Another disadvantage of high permittivity dielectrics is that thicker dielectric layers are required to compensate for the high dielectric constant. Thicker layers result in larger geometry devices, increasing overall size and cost of the integrated circuit while reducing functionality. Additionally, thick dielectric layers increase planarization problems, making it difficult to form multi-layer metallizations on top of the dielectrics.

Some electronic devices which require particularly low permittivity dielectrics actually use an air gap as a dielectric material. Such devices employ what is known as an air-bridge structure, as described by Huang et al. in their article "Optimization of a Fine Line Air-Bridge Process", GaAs MANTECH, 1990 U.S. Conference on GaAs MANufacturing TECHnology, p. 18. Air-bridge structures usually involve providing a sacrificial dielectric layer between a conductive layer and a surface of a semiconductor device, then subsequently removing the sacrificial dielectric by etching to leave the air gap. In particular, the process of etching the sacrificial dielectric is complex, expensive and often results in residue of the sacrificial dielectric. Further, because the sacrificial dielectric must be etched after the conductive layer is patterned, air-bridge processes have limited ability to pattern the conductive layer with fine lines. Air-bridge processing would be greatly simplified and reliability of such devices greatly improved if the sacrificial dielectric etch step could be eliminated.

Accordingly, it is desirable to have a low permittivity dielectric which is compatible with semiconductor processing.

SUMMARY OF THE INVENTION

Briefly stated, the present invention is achieved by a semiconductor device where electronic circuitry formed in a semiconductor substrate is separated from an overlying metal interconnect layer using a fluorinated polymer dielectric. In a method in accordance with the present invention, a fluorinated polymer layer is formed directly on metallic surfaces, and formed on a semiconductor or non-metallic surface using an adhesion promoter. Once formed, the fluorinated polymer layer can be patterned to provide vias, and covered with a patterned metal interconnect layer.

As used herein, the term "substrate" refers to a partially processed semiconductor wafer having an upper surface which may be covered by patterned dielectric, semiconductor, or metal films.

BRIEF DESCRIPTION OF THE DRAWINGS

FIG. 1 illustrates a cross-sectional view of a small portion of an integrated circuit manufactured in accordance with the present invention at an early stage in processing;

FIG. 2 illustrates a cross-sectional view of the integrated circuit shown in FIG. 1 at a later stage in processing;

FIG. 3 illustrates a cross-sectional view of the integrated circuit shown in FIG. 2 at a later stage in processing.

DETAILED DESCRIPTION OF THE DRAWINGS

Figure 4:
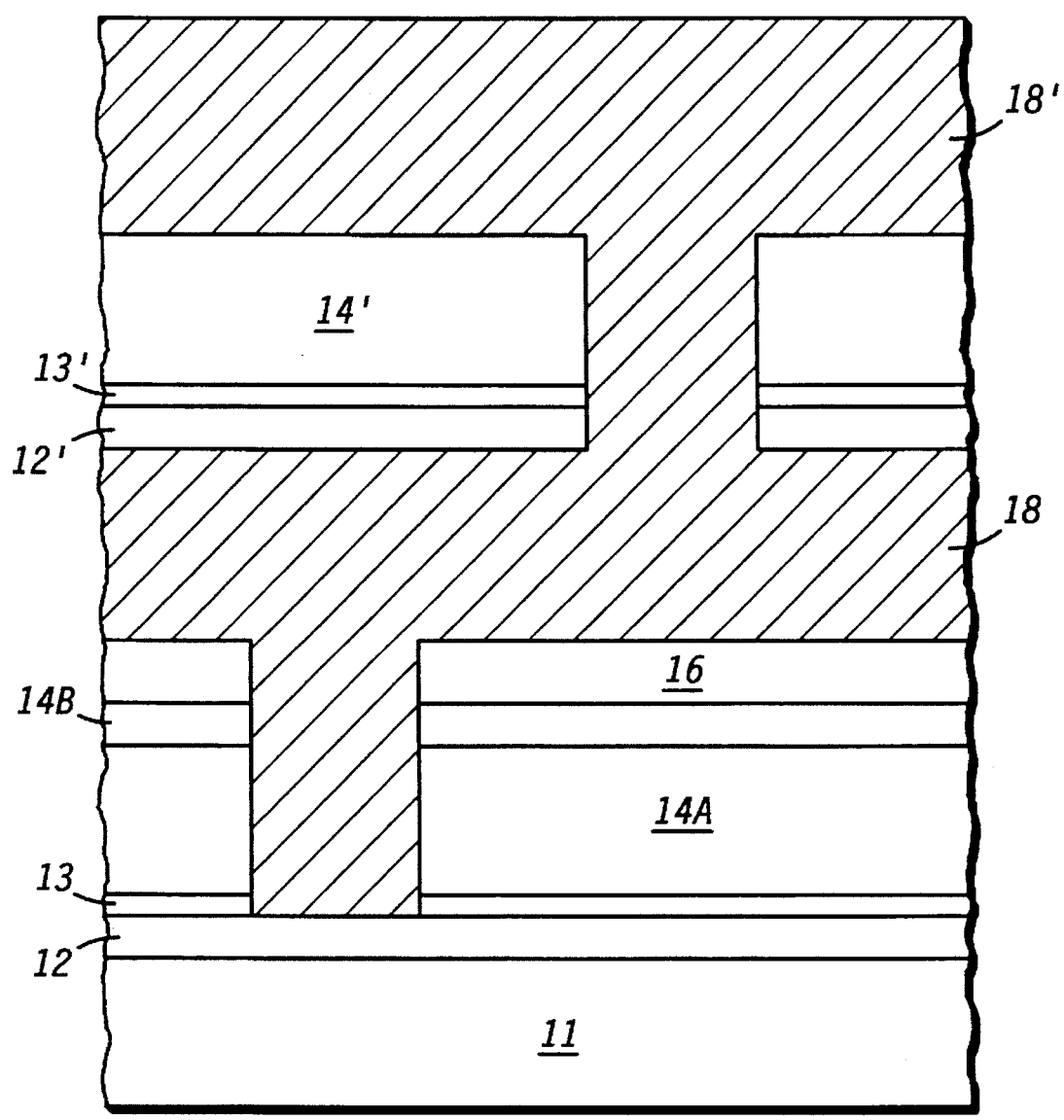
FIG. 4 illustrates a cross-sectional view of the integrated circuit shown in FIG. 3 at a later stage in processing.

Semiconductor processing places many constraints on dielectric materials used to manufacture integrated circuits. In particular, materials must withstand relatively high temperature processing, adhere well to a semiconductor substrate, and usually must be able to be patterned and etched. The present invention provides a low permittivity dielectric material and a method of processing the low permittivity dielectric which satisfies these many constraints.

Although fluorinated polymers are known to have low dielectric constants, their use in semiconductor devices has been precluded by a number of process limitations involving application of the polymer in thin, uniform layers, adhesion of the polymer to non-metallic surfaces, and patterning and etching the polymer. FIG. 1 illustrates a highly simplified view of a portion of an integrated circuit or semiconductor device using the low permittivity dielectric of the present invention. Substrate 11 comprises a semiconductor material having electronic devices formed therein. For ease of description the electronic devices are not shown, but it should be understood that any type of semiconductor device including bipolar and MOS transistors, MESFETs, JFETs, resistors, capacitors, inductors, and the like, which may be formed in or on a semiconductor substrate may be used with the present invention. Additionally, Substrate 11 may comprise silicon, germanium, or any number of compound semiconductor materials.

As a result of processing, substrate 11 will usually be covered by dielectric layer 12 comprising one or more layers of oxide, nitride, or oxynitride. If bare semiconductor material is exposed after processing, it is best to cover the semiconductor with a dielectric layer 12 for reasons described hereinbelow in reference to FIG. 3. In a preferred embodiment, substrate 11 is silicon and dielectric layer 12 comprises about 0.3 micrometers of silicon dioxide deposited by chemical vapor deposition.

Adhesion promoter layer 13 is applied to cover exposed non-metallic surfaces such as semiconductor material, oxide, nitride, and the like. Adhesion promoter 13 is not needed for metal surfaces because it has been found that fluorinated polymers adhere well to metal surfaces. It has been found that acceptable materials for adhesion promoter 13 include metal halides such as $AlCl_3$ in solution, metal alkoxides in solution, or vinyltrichlorosilane in solution. These liquid adhesion promoters may be applied by spin-coating.

A fluorinated polymer layer 14 is applied to cover the underlying structure to have a finished thickness of less than 1.5 micrometers in a preferred embodiment. Examples of fluorinated polymers are polytetrafluoroethylene (PTFE), perfluoroalkoxy resin (PFA), and fluorinated ethylene propylene (FEP). Although these materials can be applied by chemical vapor deposition, it is believed preferable to apply them by spin coating. This requires that the materials be placed in solution. In a preferred embodiment, fluorinated polymer layer 14a is formed using a PTFE having particle sizes equal to and less than 0.2 micrometers in an aqueous dispersion. Such a material is commercially available under the name Teflon TE-3170 manufactured by Du Pont. TE-3170 is usually used as a dry lubricant and in the textile industry, not the semiconductor industry. The present invention involves processes required to apply and pattern the polymer layer for use in electronic devices.

The fluorinated polymer dispersion must be heated to form a solid layer suitable for electronic devices. Heating serves two functions: first the liquid used to disperse the polymer must be evaporated, and second the polymer must be sintered to bind the PTFE particles together to form a solid layer. In many applications only first fluorinated polymer layer 14a is needed, in which case the evaporating and sintering steps are accomplished by baking at about 400°–50020 C. for five to ten minutes.

As set out above, one important feature for a dielectric material is compatibility with relatively high temperature processing. It has been found that TE-3170 becomes opaque and crystalline during the sintering process or subsequent high temperature processes. It is not believed that this crystallinity is a detrimental feature in most applications. It has been found, however, that this crystallinity is avoided by first drying at a temperature of less than 300° C. then coating the fluorinated polymer layer with a second fluorinated polymer layer having amorphous particles in a solution.

In one embodiment, the first fluorinated polymer 14a is dryed at a temperature of 200° C. for approximately 15 minutes in an air ambient and a second fluorinated polymer 14b is applied by spin coating. A good choice for second fluorinated polymer layer 14b is Teflon AF-2400 manufactured by Du Pont thinned in Fluorinert FC-75 manufactured by Minnesota Manufacturing and Mining Corporation. The multilayer fluorinated polymer 14a–14b is then sintered at 400°–500° C. for five to ten minutes. Of course, if second polymer layer 14b is not used, the drying and sintering operations can be performed simultaneously.

Fluorinated polymer layers 14a–14b may be used as a passivation, in which case no further processing may be required. It is usually necessary, however, to pattern and etch a dielectric, even if it is a passivation. It is possible to pattern and etch fluorinated polymer layers 14a–14b using conventional negative photoresist techniques, although it is difficult to achieve a high degree of selectivity between photoresist and fluorinated polymer layers 14a–14b. Improved performance is achieved by using a hard mask 16 deposited to cover dielectric layers 14a–14b. A photoresist layer 17 (negative or positive) is formed and patterned on hard mask 16 to expose portions of hard mask 16.

In an example process, hard mask 16 comprises an oxide layer formed by plasma enhanced low temperature chemical deposition using a liquid source, such as tetraethylorthosilicate (TEOS). Other materials which can be deposited at temperatures less than about 500° C. and which differentially etched with respect to fluorinated polymer layers 14a–14b are acceptable. Hard mask 16 is etched using photoresist layer 17 as a mask and using conventional etch techniques, such as reactive ion etching (RIE) as shown in FIG. 2. At this point photoresist layer 17 may optionally be removed as hard mask 16 serves as a mask for subsequent etches.

Fluorinated polymer layers 14a–14b can be etched in an RIE in an oxygen plasma to obtain the structure shown in FIG. 3. It has been found that etch rate is dramatically improved in an RIE etcher as opposed to a barrel plasma reactor. The reactive ion etch will stop on and expose a portion of dielectric layer 12. Adhesion layer 13 is so thin that it does not effect the RIE process. After the RIE step a via, or contact opening is formed in fluorinated polymer layers 14a–14b.

FIG. 4 illustrates a small portion of a multilayer metal device manufactured in accordance with the present invention. Hard mask layer 16 may optionally be removed at this point, but photoresist layer 17 should be removed. First metal layer 18 is deposited and patterned using conventional techniques to fill the via and electrically couple to the electronic devices (not shown) in substrate 11. If only one metal layer is required, device processing may be complete at this stage, or an additional fluorinated polymer dielectric layer may be applied as a passivation.

In multi-layer metal devices, a second fluorinated polymer dielectric layer 14' can be formed by substantially duplicating the processes described above to form fluorinated polymer layers 14a–14b. It should be noted that dielectric 12' and adhesion promoter 13' are often not necessary as fluorinated polymer layer 14' will adhere to first metal 18 quite well. FIG. 4 also illustrates that a hard mask layer used to pattern polymer layer 14' can be removed before deposition of second metal layer 18'.

In another embodiment in accordance with the present invention, fluorinated polymer layer 14a alone or in combination with fluorinated polymer layer 14b may substitute for an air gap in air-bridge type structures. Air-bridge structures would appear substantially the same as the cross-sectional illustrations in FIGS. 1–4. When a fluorinated polymer is used to replace an air gap in an air-bridge structure, the structure is technically speaking not an air-bridge anymore. However, for ease of description, this embodiment of the present invention will be referred to as an air-bridge type structure.

In an air-bridge structure substrate 11 would usually comprise gallium arsenide (GaAs). Total thickness of polymer layers 14a or 14a and 14b together would be in the range of three to five micrometers for an air-bridge structure. As in conventional structures, conductive layer 18 can comprise gold or multi-layer metallizations including gold and titanium One important advantage of using fluorinated polymer layers 14a, 14b in an air-bridge type device is that because of their low dielectric constant, there is no need to remove them. Thus unlike conventional air-bridge structures, fluorinated polymer layers 14a,14b serve both to support conductive layers 18 and as a final dielectric, greatly simplifying processing. Eliminating the extra processing improves reliability and quality of the air-bridge type structure.

While the invention is described with specific preferred embodiments, it is evident that many alternatives and variations will be apparent to those skilled in the semiconductor arts.

By now it should be appreciated that there has been provided a novel way to fabricate a low permittivity dielectric material for use in manufacturing semiconductor devices. A fluorinated polymer dispersion is coated onto a wafer and baked or heated to produce a dielectric layer which can withstand relatively high temperature processing and at the same time can be patterned to provide small geometry electronic devices. Using the low permittivity dielectric makes possible smaller device geometries and higher frequency operation of integrated circuits.

We claim:

1. A method for making a semiconductor device comprising the steps of: providing a semiconductor substrate having electronic devices formed therein; forming a layer of fluorinated polymer on the substrate by applying a first fluorinated polymer layer, drying the first fluorinated polymer at a temperature less than 300° C. and applying an amorphous fluorinated polymer on top of the first fluorinated polymer layer; and sintering the substrate at a temperature in the range of 400°–500° C., such that crystallinity of said first fluorinated polymer layer is avoided.

2. The method of claim 1 further comprising a step of covering the substrate with an adhesion promoter before the step of forming a layer of fluorinated polymer, wherein the step of applying an adhesion promoter further comprises spin coating the substrate with a liquid solution comprising a material selected from the group consisting of metal halide, metal alkoxide, and vinyltrichlorisilane.

3. The method of claim 1 further comprising the steps of: covering the fluorinated polymer layer with a hard mask layer; covering the hard mask layer with a photoresist layer; patterning the photoresist layer to expose portions of the hard mask layer; etching the exposed portions of the hard mask layer to expose portions of the fluorinated polymer layer; and reactive ion etching the fluorinated polymer layer in an oxygen plasma to expose portions of the substrate.

4. The method of claim 3 further comprising the steps of: removing the photoresist layer; and depositing a metal layer on the fluorinated polymer layer after the step of reactive ion etching.

5. The method of claim 4 wherein the fluorinated polymer layer has a thickness in the range of three to five micrometers.

6. The method of claim 5 further comprising the step of removing the hard mask before the step of applying a metal layer.

7. The method of claim 4 wherein the step of covering the fluorinated polymer with a hard mask layer comprises depositing a glass using a low temperature plasma enhanced chemical vapor deposition process.

* * * * *